(12) United States Patent
Mawst et al.

(10) Patent No.: US 6,219,365 B1
(45) Date of Patent: Apr. 17, 2001

(54) HIGH PERFORMANCE ALUMINUM FREE ACTIVE REGION SEMICONDUCTOR LASERS

(75) Inventors: Luke J. Mawst, Sun Prairie; Dan Botez, Madison; Abdulrahman Al-Muhanna, Madison; Jerome Kent Wade, Madison, all of WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 09/185,354

(22) Filed: Nov. 3, 1998

(51) Int. Cl.$^7$ .................................................. H01S 5/343
(52) U.S. Cl. .............................................. 372/46; 372/45
(58) Field of Search .......................................... 372/45, 46

(56) References Cited

U.S. PATENT DOCUMENTS

| | | | |
|---|---|---|---|
| 5,222,090 | 6/1993 | Serreze .................................... | 372/45 |
| 5,389,396 | 2/1995 | Razeghi .................................. | 427/58 |
| 5,889,805 | 3/1999 | Botez et al. ............................ | 372/45 |
| 6,028,874 | * 2/2000 | Wada et al. ............................. | 372/45 |
| 6,028,875 | * 2/2000 | Knight et al. ........................... | 372/46 |
| 6,127,691 | * 10/2000 | Fukunaga et al. ...................... | 257/17 |

OTHER PUBLICATIONS

D.P. Bour, et al., "Tensile–Strained AlGaAsP–and InGaAsP–(AlGa)0.5In0.5P Quantum Well Laser Diodes for TM–Mode Emission in the Wavelength Range 650 <λ< 850 nm," IEEE Photonics Technology Letters, vol. 6, No. 11, Nov., 1994, pp. 1283–1285.

M. Sagawa, et al., "High–Power Highly–Reliable Operation of 0.98–$\mu$m InGaAs–InGaP Strain–Compensated Single–Quantum–Well Lasers with Tensile–Strained InGaAsP Barriers," IEEE Journal of Selected Topics in Quantum Electronics, vol. 1, No. 2, Jun., 1995, pp. 189–195.

Toshiaki Fukunaga, et al., "Reliable Operation of Strain–Compensated 1.06 $\mu$m InGaAs/InGaAsP/GaAs Single Quantum Well Lasers," Appl. Phys. Lett., vol. 69, No. 2, Jul. 8, 1996, pp. 248–250.

A. Al–Muhanna, et al., "780 nm–emitting Al–Free Active Region Diode Lasers with Compressively–Strained InGaAsP Quantum Wells," Conference Proceedings, LEOS '97, Nov. 10–13, 1997, pp. 201–202.

M.A. Emanuel, et al., "High–Power InAlGaAs–GaAs Laser Diode Emitting Near 731 nm," IEEE Photonics Technology Letters, vol. 9, No. 11, Nov., 1997, pp. 1451–1453.

A. Al–Muhanna, et al., "730–nm–Emitting Al–Free Active–Region Diode Lasers with Compressively Strained InGaAsP Quantum Wells," Applied Physics Letters, vol. 72, No. 6, Feb. 9, 1998, pp. 641–643.

A. Al–Muhanna, et al., "High–Performance, Reliable, 730 nm–Emitting Al–Free Active Region Diode Lasers," 1998 IEEE 16$^{th}$ International Semiconductor Laser Conference, Nara, Japan, Oct. 4–8, 1998, Conference Digest, pp. 139–140

* cited by examiner

*Primary Examiner*—James W. Davie
(74) *Attorney, Agent, or Firm*—Foley & Lardner (57) ABSTRACT

The semiconductor laser emitting light in the wavelength range of about 700 nm to 800 nm utilizes an aluminum-free active region layer. An epitaxial structure is grown on a GaAs or AlGaAs substrate and includes an active region layer, confinement layers adjacent the active region layer, and cladding layers adjacent the confinement layers. The active region layer comprises at least one compressively strained InGaAsP quantum well surrounded by transitional layers, with the composition and width of the active region selected to emit light at a selected wavelength, particularly between about 700 nm and 800 nm. High band-gap InGaAlP cladding layers and confinement layers may be utilized to suppress carrier leakage, and the epitaxial structure may be grown on a misoriented substrate to further reduce carrier leakage from the quantum well and improve the crystalline quality of the quantum well. The lasers are capable of operating at high powers with high reliability for longer lifetimes than are obtainable with laser structures emitting the same wavelength range which require the use of aluminum in the active region.

43 Claims, 10 Drawing Sheets

HIGH PERFORMANCE ALUMINUM FREE ACTIVE REGION SEMICONDUCTOR LASERS

This invention was made with United States government support awarded by the following agency: NSF Grant No: 9522035. The United States has certain rights in this invention.

FIELD OF THE INVENTION

This invention pertains generally to the field of semiconductor diode lasers and particularly to semiconductor lasers emitting at wavelengths in the range of 700 nm to 800 nm.

BACKGROUND OF THE INVENTION

Semiconductor diode lasers are formed of multiple layers of semiconductor materials. The typical semiconductor diode laser includes an n-type layer, a p-type layer and an undoped active layer between them such that when the diode is forward biased electrons and holes recombine in the active region layer with the resulting emission of light. The layers adjacent to the active layer typically have a lower index of refraction than the active layer and form cladding layers that confine the emitted light to the active layer and sometimes to adjacent layers. Semiconductor lasers may be constructed to be either edge emitting or surface emitting. In an edge emitting Fabry-Perot type semiconductor laser, crystal facet mirrors are located at opposite edges of the multi-layer structure to provide feedback reflection of the emitted light back and forth in a longitudinal direction, generally in the plane of the layers, to provide lasing action and emission of laser light from one of the facets. Another type of device, which may be designed to be either edge emitting or surface emitting, utilizes distributed feedback structures rather than conventional facets or mirrors, providing feedback for lasing as a result of backward Bragg scattering from periodic variations of the refractive index or the gain or both of the semiconductor laser structure.

High output power diode lasers with wavelengths in the 730–780 nm range are needed for a variety of applications ranging from laser printing and optical recording to cancer treatments such as photodynamic therapy. For wavelengths less than 840 nm, typical laser structures use AlGaAs in the active region, which can result in long-term reliability problems. For devices intended to operate with emission wavelengths less than 780 nm, the high aluminum content of the $Al_xGa_{1-x}As$ active layer (x>0.1) required to obtain light emission at such wavelengths makes reliable high-power operation increasingly difficult to achieve. The high surface recombination velocity for AlGaAs leads to catastrophic optical mirror damage (COMD) at relatively low power densities. Even small Al concentrations (e.g., x≈0.07–0.10) lead to significant reductions in internal power densities at COMD. Using a specially processed oxygen gettered aluminum source for the metal-organic chemical-vapor deposition (MOCVD) growth process, AlGaAs active-layer devices (100 $\mu$m-wide emission aperture) have been reported with continuous wave (cw) output powers of 540 mW at an emission wavelength of 715 nm. P. L. Tihanyi, F. C. Jain, M. J. Robinson, J. E. Dixon, J. E. Williams, K. Meehan, M. S. O'Neill, L. S. Heath, and D. M. Beyea, IEEE Photonics Technol. Lett. 6, 775 (1994). More recently, compressively strained AlGaInAs active-layer lasers have been reported in the 730 nm wavelength range demonstrating 2.2 W cw output powers from broad-stripe (100 $\mu$m-wide) devices. M. A. Emanuel, J. A. Skidmore, M. Jansen and R. Nabiev, IEEE Photonics Technol. Lett. 9, 1451 (1997). Although high output powers have been obtained from the AlGa(In)As active-layer devices, long-term reliability is still an open question because, even if the mirror facets are passivated, since defects in the bulk of the active region material cause device degradation. For such devices emitting at wavelengths in the range of 700 nm to 780 nm there is no extensive lifetest data and high power devices are not commercially available.

The lower surface recombination velocity of InGaAsP compared with AlGaAs leads to a corresponding reduction in facet-temperature rise during high-power cw operation. D. Z. Garbuzov, N. Yu. Antonishkis, A. D. Bondarev, A. B. Gulakov, S. N. Zhigulin, N. I, Katsavets, A. V. Kochergin, and E. V. Rafailov, IEEE J. Quantum Electron. QE-27, 1531 (1991). Tensile-strained (In)GaAsP active-layer lasers have been reported operating in the 700–800 nm wavelength range. D. P. Bour, D. W. Treat, K. J. Beernink, R. L. Thornton, T. L. Paoli, and R. D. Bringans, IEEE Photonics Technol. Lett. 6, 1283 (1994). However, little is known about the properties of compressively strained quantum-well lasers in this wavelength region. Compressively strained active layers have been reported with emission at 980 nm, D. F. Welch, W. Streifer, C. F. Schaus, S. Sun and P. L. Gourley, Appl. Phys. Lett. 56, 10 (1990); at 1.3 $\mu$m, P. J. A. Thijs, L. F. Tiemeijer, J. J. M. Binsma and T. van Dongen, IEEE J. Quantum Electron. QE-30, 477 (1994); and at 1.55 $\mu$m, A. Mathur and P. Dapkus, IEEE J. Quantum Electron. QE-32, 3223 (1996).

SUMMARY OF THE INVENTION

In accordance with the invention, a semiconductor laser is provided which may be constructed to emit light in the wavelength range of about 700 nm to 800 nm, and for some applications at longer wavelengths, utilizing an aluminum free active region layer. Because the active region is aluminum free, much higher internal power densities at the point of catastrophic optical mirror damage are obtained as compared to conventional semiconductor laser structures which require the presence of aluminum in the active region in order to provide emission in the 700 nm to 800 nm range. The laser structures of the invention are capable of operating at high power with high reliability with the long lifetimes required for commercially feasible lasers.

The semiconductor laser of the invention includes a crystalline semiconductor substrate (e.g., GaAs or AlGaAs), an epitaxial structure on the substrate including a layer with an active region at which light emission occurs, confinement layers adjacent the active region layer, cladding layers adjacent the confinement layers, edge faces, electrodes by which voltage can be applied across the epitaxial structure and the substrate, and feedback structures to provide optical feedback for lasing in the active region layer. The active region layer is aluminum free and comprises at least one compressively strained InGaAsP quantum well surrounded by transitional layers of, e.g., InGaP, InGaAsP, or GaAsP, with the active region selected to emit light at a wavelength in the range of about 700 nm to 800 nm. The selection of the wavelength at which the active region emits may be determined by selection of the relative composition of the material of the active region and the width of the quantum well. A preferred structure in accordance with the invention utilizes high band-gap InGaAlP cladding layers and confinement layers to suppress carrier leakage.

It is also preferred in accordance with the invention that the epitaxial structure be grown on a substrate surface off orientation with respect to a major crystalline plane, preferably at least 5° off orientation, e.g., on (100) substrates misoriented 5° to 20° toward <111>. Growth of the epitaxial structure on highly misoriented substrates disorders the InGaAlP layers, increasing the band-gap significantly (by about 70 meV). This larger band-gap further reduces carrier leakage from the quantum well, with corresponding very low temperature sensitivity for such devices constructed for wavelength emissions of at least 700 nm. The strong carrier confinement allows high cw power to be achieved without substantially affecting other device parameters.

Further objects, features and advantages of the invention will be apparent from the following detailed description when taken in conjunction with the accompanying drawings.

DETAILED DESCRIPTION OF THE DRAWINGS

In the drawings.

DETAILED DESCRIPTION OF THE INVENTION

Figure 1:
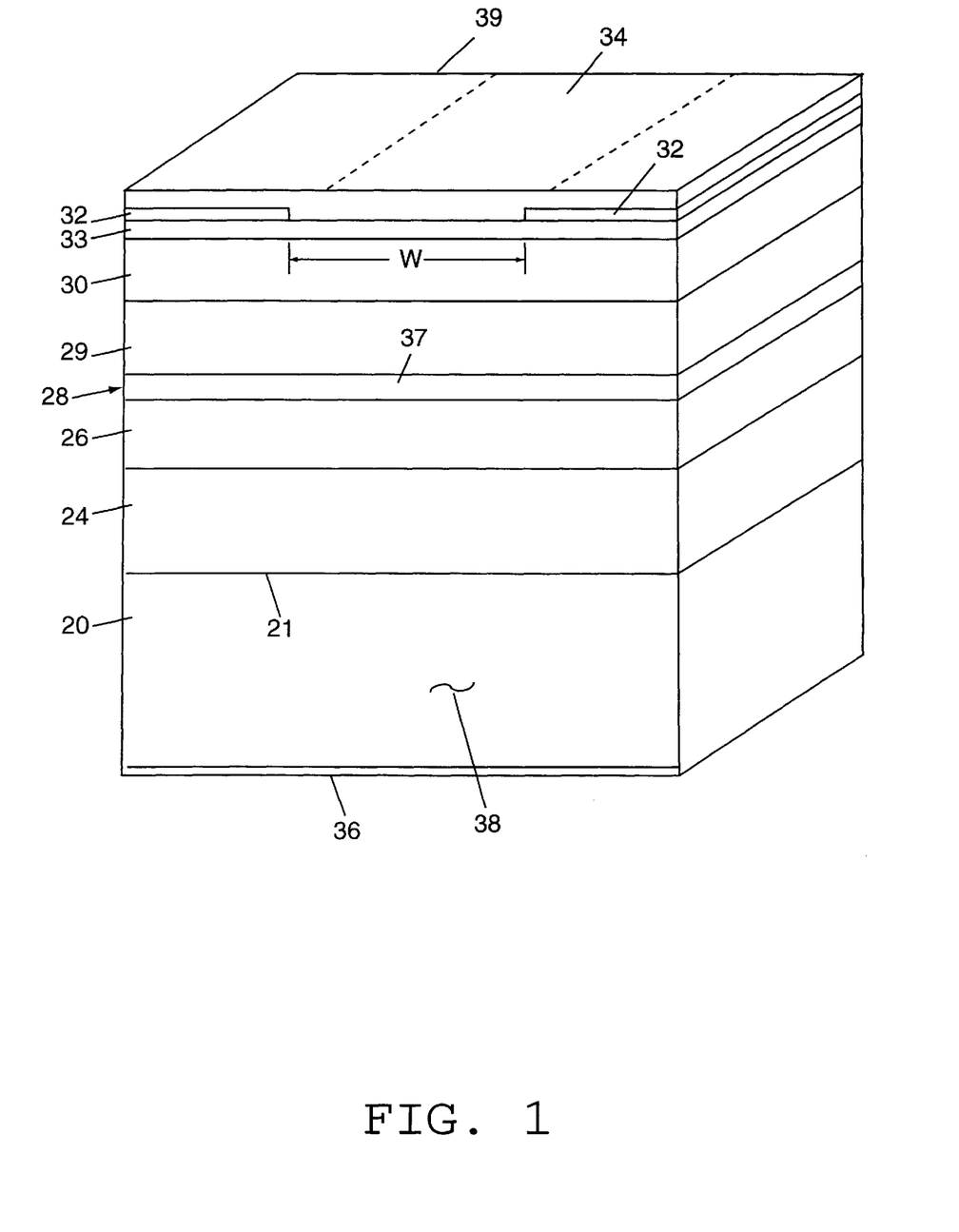
FIG. 1 is a perspective view of an exemplary semiconductor laser structure formed in accordance with the invention.

A simplified perspective view of a semiconductor laser in accordance with the invention is shown in FIG. 1. The layers illustrated in FIG. 1 are epitaxially grown on a crystalline semiconductor substrate 20 such as GaAs or AlGaAs. As indicated below, the top surface 21 of the substrate 20 is preferably oriented somewhat off of the (100) plane of the, e.g., GaAs substrate 20. The epitaxial layers grown on the surface 21 may include a lower cladding layer 24, a lower confinement layer 26, an active region layer 28, an upper confinement layer 29, and an upper cladding layer 30. In accordance with the invention, the active region layer 28 is formed to be aluminum free and to emit at wavelengths of at least 700 nm, and especially in the range of about 700 nm to 800 nm. The active region layer 28 is formed of at least one InGaAsP quantum well surrounded by transitional layers, e.g., of InGaP, InGaAsP, or GaAsP. The active region layer is compressively strained, typically with a maximum strain value $\Delta a/a = (a_{layer} - a_{substrate})/a_{substrate}$ of about 2–2.5%, where "$a_{layer}$" is the lattice spacing of the InGaAsP material. Higher strain results in defect formation for typical quantum well widths (~10–15 nm). The emission wavelength can be selected by selection of the composition (x,y) of the quarternary $In_xGa_{1-x}As_yP_{1-y}$ material or the width of the quantum well layer or both. Suitable exemplary confinement layers are formed of $In_{0.5}(Al_xGa_{1-x})_{0.5}P$, wherein $0.0 \leq x \leq 0.3$, and suitable exemplary cladding layers are formed of $In_{0.5}(Al_yGa_{1-y})_{0.5}P$, wherein $0.3 \leq y \leq 0.8$. For exemplification only, current confinement may be provided to define the emitting aperture by insulating layers 32 of SiO2 over a cap layer 33 of p+ GaAs, with a top metal electrode 34 in contact with the cap layer 33 at the top face of the laser between the insulating $SiO_2$ layers 32 to provide electrical conduction thereto. A bottom metal electrode 36 is formed on the bottom face of the substrate 20 so that voltage may be applied across the semiconductor laser between the electrodes 34 and 36. The electrodes may be formed in any other desired fashion. The width "W" of the metal electrode 34 in contact with the cap layer 33 defines the effective stripe 37 of the semiconductor diode in the active layer 28 at which light emission will occur. The front face 38 and back face 39 of the semiconductor structure of FIG. 1 are formed as facets substantially perpendicular to the active region layer 28 in a conventional manner, with one facet being mirror coated to be substantially reflecting and the other mirror coated to be partially anti-reflecting, and are exemplary of the conventional feedback structures that may be used to provide optical feedback for lasing action.

Figure 2:
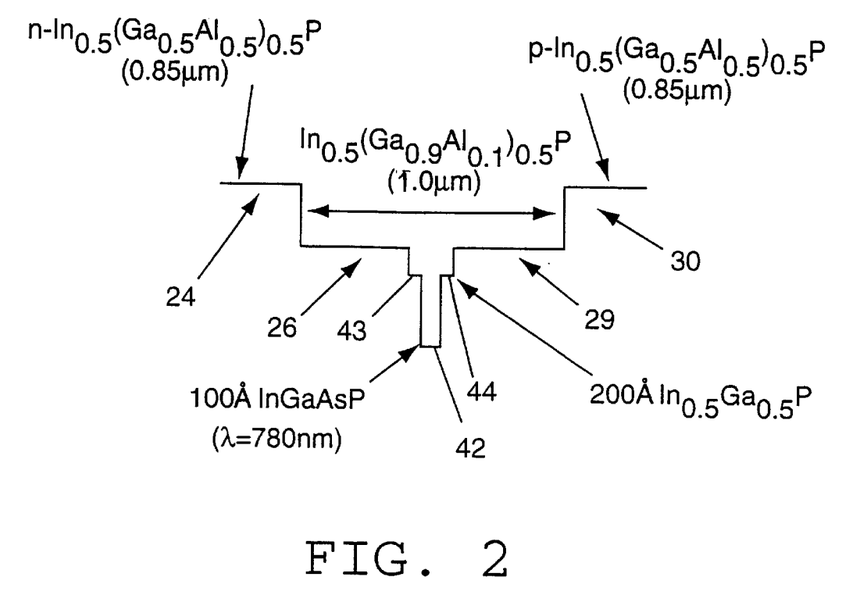
FIG. 2 is a schematic band-gap diagram of an aluminum-free active region 780 nm emitting laser structure with a broad-waveguide design.
Figure 3:
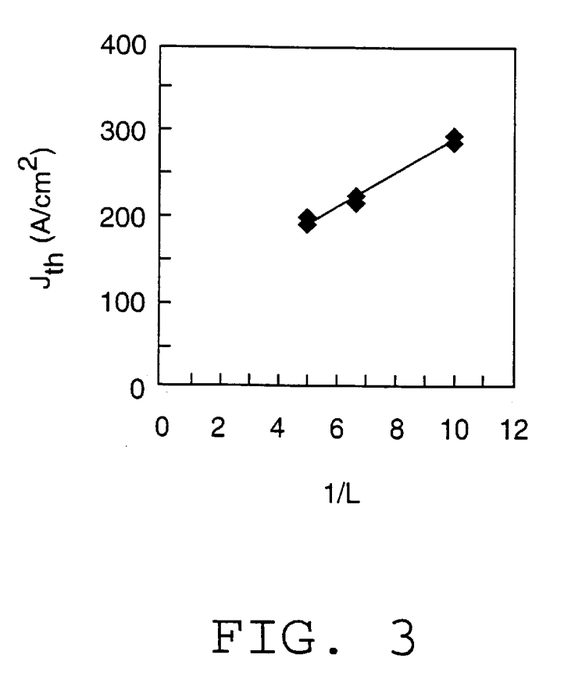
FIG. 3 is a diagram showing a plot of $J_t$ as a function of 1/L (L=device capacity length) for a 100 μm-wide laser diode of the type shown in FIG. 2.
Figure 4:
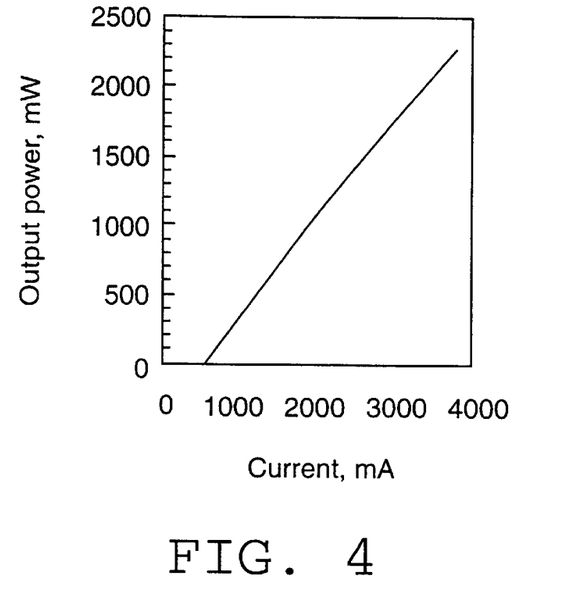
FIG. 4 is a diagram showing the cw L-I characteristics for a single quantum well (2 mm×100 μm) laser of the type shown in FIG. 2.

A first exemplary laser of this type emitting at 780 nm has the structure shown in FIG. 2. The epitaxial structure of FIG. 2 has an active region 28 formed of a 10 nm thick compressively strained InGaAsP ($\Delta a/a=0.85\%$, as determined by DCXRD on bulk layers) quantum well layer 42 surrounded by $In_{0.5}Ga_{0.5}P$ (200 Å thick) transitional (barrier) layers 43 and 44, $In_{0.5}(Ga_{0.9}Al_{0.1})_{0.5}P$ confinement layers 26 and 29 (total width across confinement layers, 1.0 μm), and $In_{0.5}(Ga_{0.5}Al_{0.5})_{0.5}P$ (0.85 μm thick) cladding layers 24 and 30. The use of high band-gap Al-containing cladding layers 24 and 30 is effective in reducing carrier leakage. Broad area (100 μm stripe width) lasers were fabricated by low-pressure metalorganic chemical vapor deposition (LP-MOCVD) and were characterized as a function of cavity length under low duty-cycle pulsed operation. FIG. 3 shows the variation of the threshold current density, $J_{th}$ with inverse device length, 1/L. $J_{th}$ for 1 mm long devices is 290 A/cm². As a result of the use of a broad waveguide, low internal loss is achieved ($\alpha_i$=3cm⁻¹, $\eta_i$=79%) because the field interaction with the highly-doped cladding layers is minimal. $J_{th}$ and $\eta_d$ were measured as a function of temperature from 20° C. to 60° C. A best-fit analysis shows $T_0$=75 K, where $T_0$ is the characteristic temperature for $J_{th}$. For devices incorporating a second quantum well, (e.g., two quantum well layers 42 separated by a layer of $In_{0.5}Ga_{0.5}P$), $T_0$ was improved to 155 K and the differential quantum efficiency characteristic temperature, $T_1$, to 384 K. Cw L-I characteristics for a single quantum well laser with 2 mm cavity-length and 100 μm stripe-width is shown in FIG. 4, indicating cw front-facet output powers up to 2.2 W. The external differential quantum efficiency is 66%.

Additional exemplary laser structures were grown by low-pressure metal-organic chemical-vapor deposition on (100) GaAs substrates misoriented 0.5° towards <110>. The laser structure shown in FIG. 5 uses a 15 nm thick compressively strained InGaAsP ($\Delta a/a \approx 1.4\%$) quantum well 42 surrounded by $In_{0.5}Ga_{0.5}P$ (200 Å) transitional layers 43 and 44. Under these growth conditions, InGaP is partially ordered ($E_g$=1.87 eV). Since the InGaAsP/GaAs material system has small band-gap differences, massive carrier leakage from the active region 28 has been the major impediment to reach COMD in (completely) Al-free laser structures in the 800 nm wavelength region. $In_{0.5}(Ga_{0.5}Al_{0.50.5}P$ (0.75 μm thick) cladding layers 24 and 30 were employed to reduce carrier leakage. As the wavelength of such devices is shortened towards 730 nm, carrier leakage becomes more severe, which can degrade device performance even further. For this reason, high-band-gap $In_{0.5}(Ga_{0.9}Al_{0.1})_{0.5}P$ material (0.8 μm) was utilized for the confinement layers 26 and 29 to reduce active-region carrier leakage into the confining layers.

Figure 5:
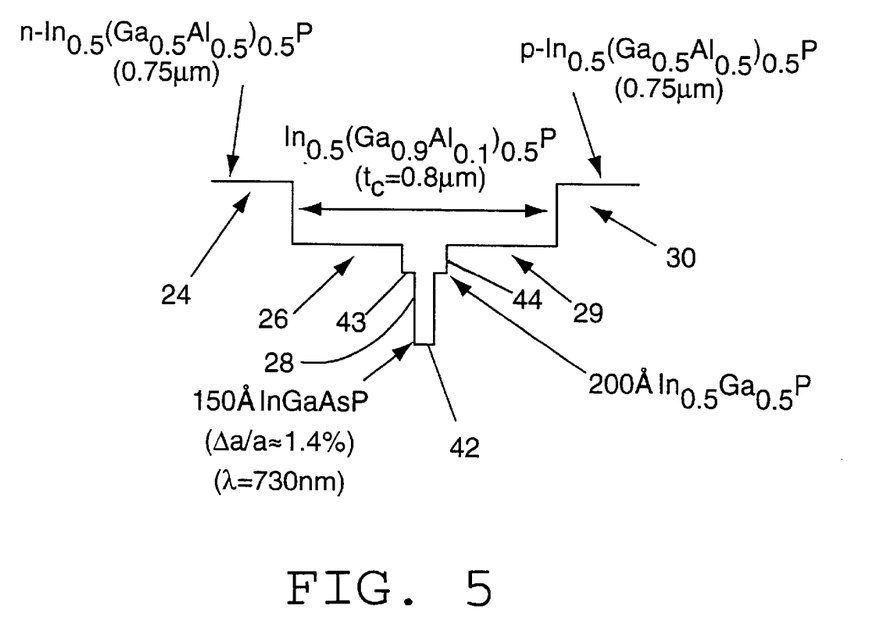
FIG. 5 is a schematic band-gap diagram of another aluminum-free active region laser emitting at 730 nm with a broad-waveguide design.

To measure the amount of strain in the quantum well, three 75 Å quantum wells separated by 1000 Å GaAs layers were grown under the same conditions as the laser structure. Double-crystal x-ray diffraction measurements were performed and compared with simulated rocking curves confirming the amount of strain, $\Delta a/a$=1.4%–1.6%.

Figure 6:
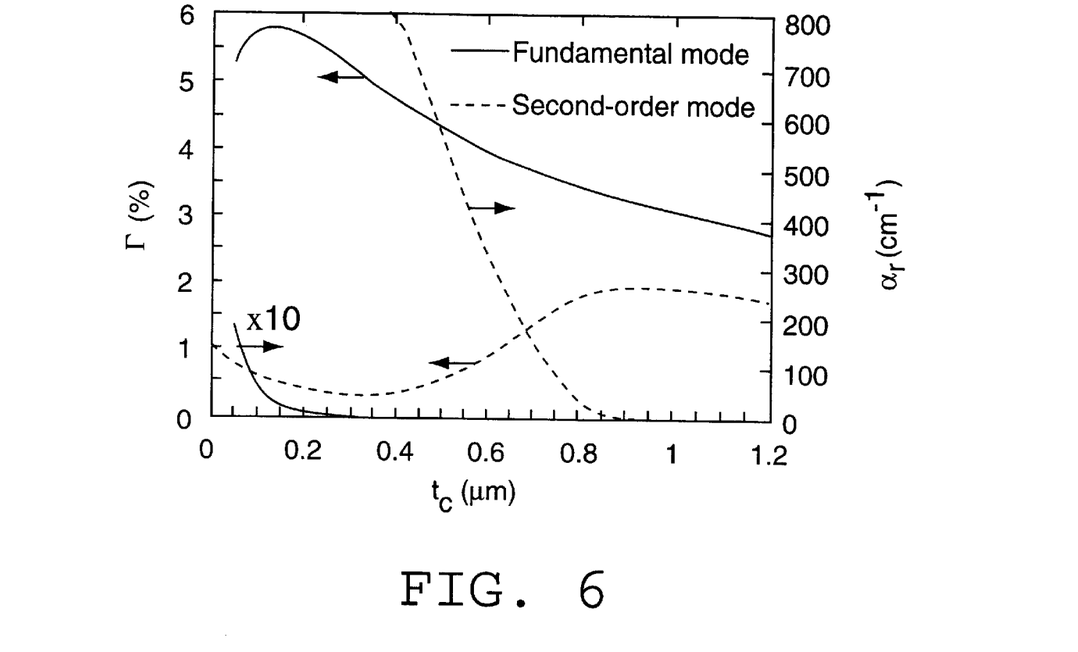
FIG. 6 are diagrams illustrating calculated optical confinement factor and radiation losses for the fundamental and second order transverse modes versus waveguide width $t_c$ for the laser structure of FIG. 5.

To achieve high output powers in the devices of the invention, a broad-waveguide design is employed. Design curves for the broad-waveguide structure are shown in FIG. 6, which includes optical confinement factors, Γ, and radiation losses to the GaAs p+cap 33 and underlying substrate 20, $\alpha_r$, for both fundamental and second-order modes. A curve for the first-order mode is not shown because its overlap with the quantum well is small (i.e., $\Gamma_1$=0). As the $In_{0.5}(Ga_{0.9}Al_{0.10.5}P$ waveguide width, $t_c$ (as shown in FIG. 5), increases, it is seen that the active-layer optical confinement factor, Γ, decreases from the optimal value (at $t_c$=0.1 μm) for achieving the lowest threshold current. Although the lowest possible threshold current density is not obtained for large tc values, a large equivalent transverse spot size, d/Γ, is achieved, where d is the thickness of the quantum well(s).

However, excessive increase in the waveguide width, $t_c$>1 μm, results in multimode operation at high output powers despite the difference between $\Gamma_0$ and $\Gamma_2$, which results in a relatively small increase in threshold current for the second-order mode, $J_{th2}/J_{th0}$=1.9. To increase discrimination, it is preferred that thinner confinement layers are employed, $t_c$=0.8 μm, such that $\alpha_{r2>>}\alpha_{r0}$, $\alpha_{r2}$=39.16 cm⁻¹, $\alpha_{r0}$=0.012 cm⁻¹, resulting in $J_{th2}/J_{th0}$=6.8, which is large enough to suppress the second-order mode. Accordingly, reasonably large equivalent transverse spot size, d/Γ=0.433 μm, is obtained while maintaining singe transverse-mode operation.

Figure 7:
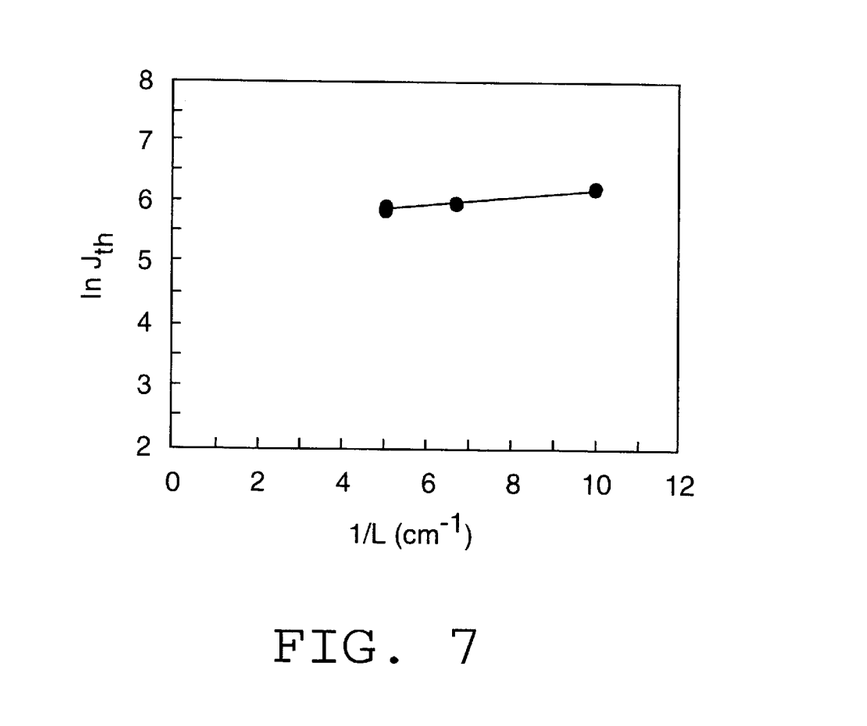
FIG. 7 is a diagram illustrating the measured dependence of threshold current density $J_o$ as a function of (inverse) device cavity length L for a device of the type shown in FIG. 5.
Figure 8:
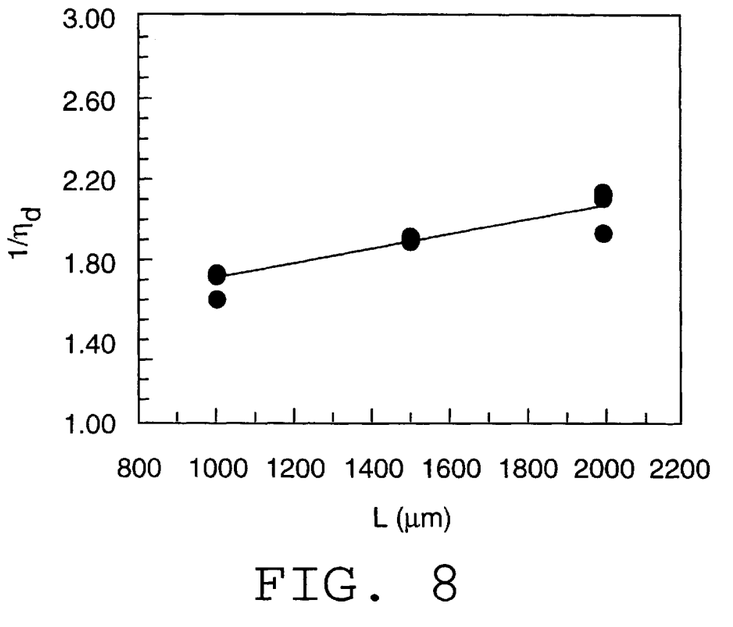
FIG. 8 is a diagram showing the inverse of external differential quantum efficiency as a function of the device length L for the device of the type shown in FIG. 5.
Figure 9:
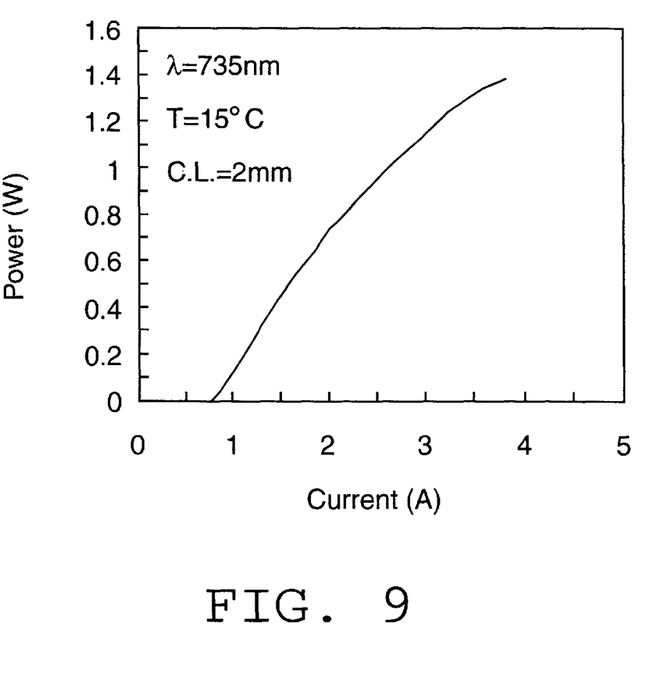
FIG. 9 is a diagram showing the cw L-I characteristics for a (90%/10%) facet-coated 730 nm emitting quantum well (100 μm×2 nm) laser of the type shown in FIG. 5.

Broad-area (100 μm wide stripe) devices were fabricated and characterized as a function of cavity length under low-duty-cycle pulsed current operation. FIGS. 7 and 8 show the variation of the threshold current density, $J_{th}$, and external differential quantum efficiency, $\eta_d$, with device length, L. $J_{th}$ for 1 mm long devices is 514 A/cm². Using published relationships between threshold current density, $J_{th}$, transparency current density, $J_T$, and gain saturation parameter, $G_0$, calculations show $J_T$=173 A/cm² and $G_0$=549 cm⁻¹. As a result of the use of a broad waveguide, low internal loss is achieved ($\alpha_i$=3 cm⁻¹, $\eta_i$=75%) because the field interaction with the highly doped cladding layers is minimal. $J_{th}$ and $\eta_d$ were measured as a function of temperature from 20 to 60° C. A best-fit analysis gives characteristic temperature coefficients of threshold current, $T_0$, and external differential quantum efficiency characteristic temperature, $T_1$, values of 72 K and 153 K, respectively. The relatively high values obtained for $T_0$ and $T_1$ reflect the strong carrier confinement resulting from the use of $In_{0.5}(Ga_{0.5}Al_{0.5})_{0.5}P$ cladding layers. For cw measurements, devices are mounted junction-side down on a copper submount and the testing stage is maintained at 15° C. using thermoelectric cooling. Cw L-I characteristics for a broad-stripe (100 μm wide×2 mm long) facet-coated (90%/10% reflectivity of the two faces 38 and 39) devices is shown in FIG. 9, indicating cw output powers up to 1.4 W. This corresponds to a COMD power density level of 3.4 MW/cm², assuming COMD occurs across the entire 100 μm facet. The sudden failure observed at power levels well below the expected maximum COMD indicates strong filamentation is occurring. In broad-stripe devices, filamentation leads to localized COMD, confirmed by postmortem inspection. Thus, higher output powers can be obtained by reducing filamentation through the use of smaller stripe widths, more efficient heat removal, and improved material uniformity. Fundamental transverse mode operation was confirmed by measuring the far-field distribution in the transverse direction. The full width at half maximum $\theta_1$, is 38° and full width at 1/e² is 68° over the whole range of drive current. These values are in very good agreement with the calculated fundamental transverse-mode far-field distribution, and indicate that the second-order transverse mode is suppressed.

Figure 10:
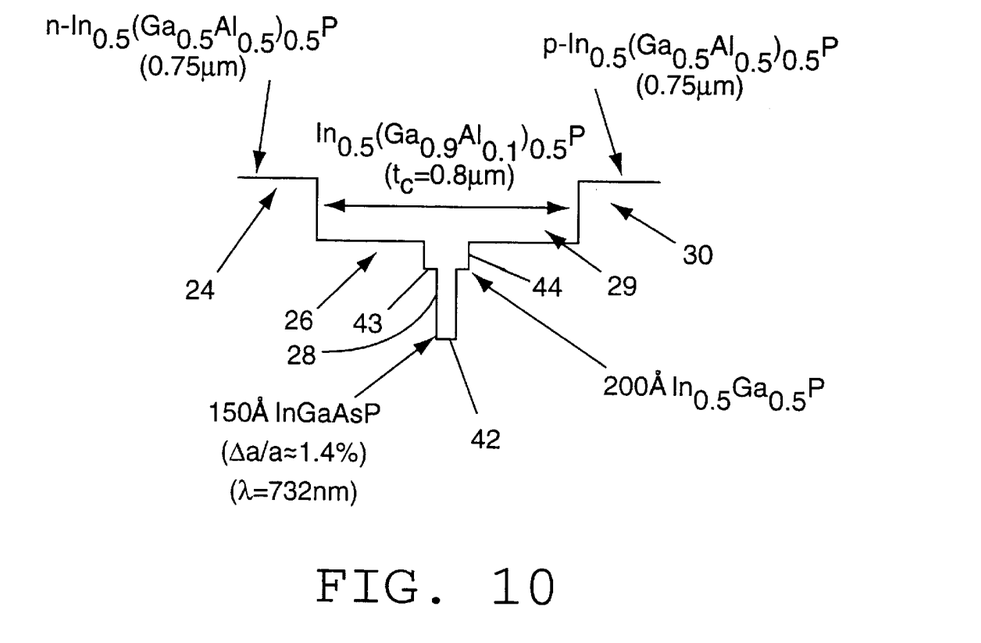
FIG. 10 is a schematic band-gap diagram of another aluminum-free active region 730 nm laser structure with a broad-waveguide design grown highly off orientation.

A further laser structure as shown in FIG. 10 was grown by low-pressure (50 mbar) metal organic chemical vapor deposition at a growth temperature of 700° C., and was grown further off orientation on a GaAs substrate. The epitaxial structure includes a 150 Å-thick compressively strained ($\Delta a/a \approx 1.4\%$) InGaAsP quantum well 42 surrounded by 200 Å $In_{0.5}Ga_{0.5}P$ transition layers 43 and 44. High band-gap $In_{0.5}Ga_{0.5}Al_{0.5)0.5}P$ (0.75 μm thick) cladding layers 24 and 30 and $In_{0.5}(Ga_{0.9}Al_{0.1})_{0.5}P$ (0.8 μm total width) confining layers 26 and 29 are used to suppress carrier leakage. The transition or barrier layer 43 and 44 may be partially grown in tensile strain to provide a strain compensated active region layer. Strained-compensated quantum-well devices are generally found to provide improved reliability compared to simply compressive-strained quantum-well devices. M. Sagawa, T. Toyonaka, K. Hiramoto, K. Shinoda, and K. Uomi, IEEE J. Select. Topics in Quantum Electronics, Vol. 1, No. 2, pp. 189–195, 1995; and T. Fukunaga, M. Wada, and T. Hayokawa, Appl. Phys. Lett., Vol. 69, pp. 248–250, July, 1996.

Figure 11:
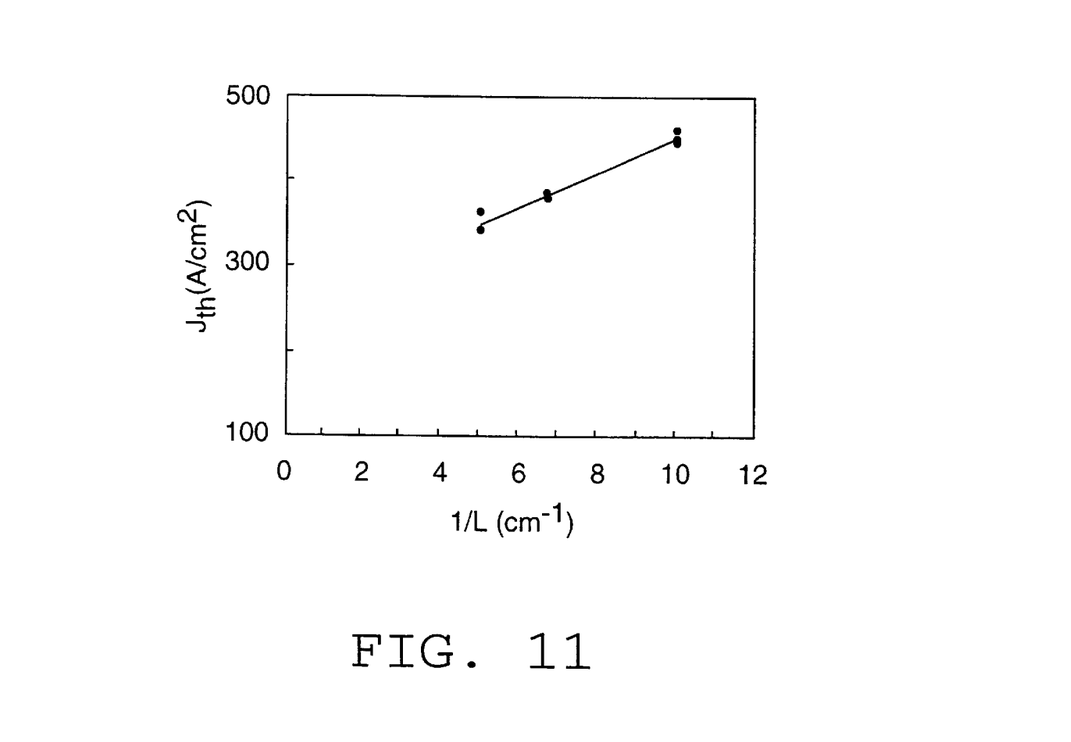
FIG. 11 is a diagram illustrating a fitted curve for threshold current density $J_{th}$ versus 1/L, where L is the device cavity length, for a laser structure of the type shown in FIG. 10.
Figure 12:
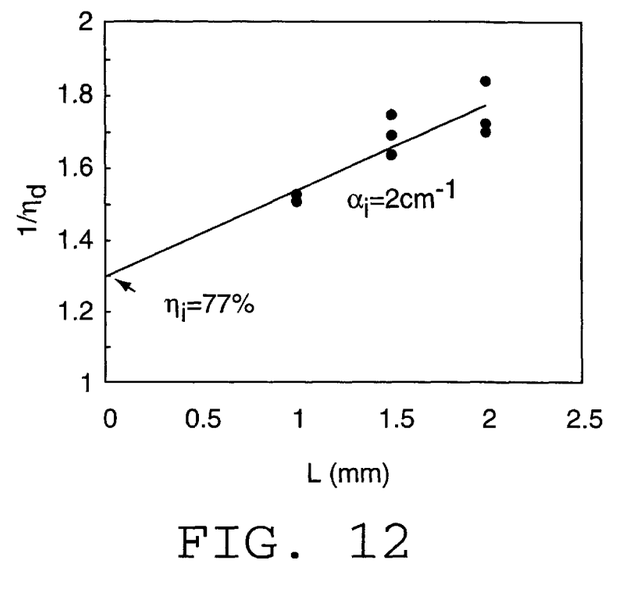
FIG. 12 is a diagram showing the inverse of the external differential quantum efficiency as a function of device length L for the device of the type shown in FIG. 10.

Broad-stripe, 100 μm wide, devices were fabricated and tested under low duty-cycle pulsed-current conditions to determine the device characteristics as a function of cavity length. FIGS. 11 and 12 show the variation of the threshold current density, $J_{th}$, and external differential quantum efficiency, $\eta_d$, with device length, L. At 20° C., $J_{th}$=450 A/cm² and $\eta_d$=65% for 1 mm long devices. The relatively high threshold current density is due to the fact that these structures are designed for high output power operation with a large transverse spot size (d/Γ=0.43 μm). Using published relationships between threshold current density, $J_{th}$, transparency current density, $J_T$, and gain saturation parameter, $G_0$, we obtain:

$$J_{th} = \frac{J_T}{\eta_i} \exp\left(\frac{\alpha_i + \frac{1}{L}\ln\left(\frac{1}{R}\right)}{\Gamma G_0}\right)$$

where $\eta_i$, $\alpha_i$, and Γ are the internal efficiency, the internal loss, and the optical confinement factor, respectively. A best fit to the measured data gives $J_T$=187 A/cm² and $\Gamma G_0$=23 cm⁻¹.

Figure 13:
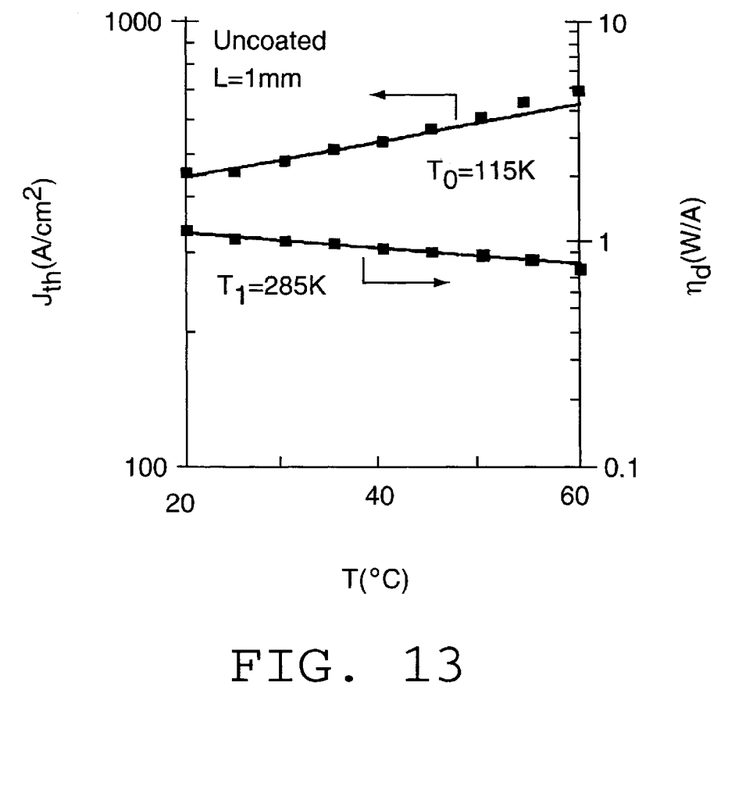
FIG. 13 are plots showing a best fit to curves for Jt and external differential quantum efficiency versus temperature for 1 mm long devices of the type shown in FIG. 10.

As shown in FIG. 12, a broad waveguide (0.8 μm thick) design allows for low internal losses ($\alpha_i$=2 cm⁻¹, $\eta_i$=77%) with a large transverse spot size (d/Γ=0.43 μm). The use of $In_{0.5}(Ga_{0.5}Al_{05})_{0.5}P$ cladding layers 24 and 30 results in very high values for the characteristic temperature coefficients of threshold current and external differential quantum efficiency ($T_0$=115 K and $T_1$=285 K, as shown in FIG. 13) compared to those for typical $Al_{0.6}Ga_{0.4}As$ clad devices (e.g., $T_0$=37 K and $T_1$=63 K). This improvement can be attributed to the superior carrier confinement provided by the $In_{0.5}(Ga_{0.5}Al_{0.5})_{0.5}P$ cladding layers. Even though the direct gap of $Al_xGa_{1-x}As$ may be larger, the X-valley (x>0.45) is at a lower energy, thereby increasing the carrier leakage. Because the X-valley is relatively constant with composition, there is little, if any, reduction in carrier leakage for Al compositions greater than ~45%. Thus, $In_{0.5}(Ga_{0.5}Al_{0.5})_{0.5}P$ cladding layers provide barrier heights about 200 meV larger than that obtainable from high AlGaAs.

The structure of FIG. 10 is similar to that of FIG. 5 except it was grown on (100) substrates misoriented 100 towards <111>A. Growth on highly misoriented substrates (e.g., 5° to 20° misoriented) completely disorders In(GaAl)P, increasing the band-gap by about 70 meV. The larger band-gap further reduces carrier leakage from the quantum well, leading to very low temperature sensitivity for the wavelength region of operation of these devices. Table 1 below provides a comparison between the structure of FIG. 10 and essentially the same structure of FIG. 5 which is grown on slightly miscut substrates ((100) 0.5° towards <110>), and illustrates the benefit of using highly misoriented substrates in improving the device performance. $J_{th}$, $T_0$ and $T_1$ are measured for 1 mm long devices and $J_T$, Γ, $G_0$, $\alpha_i$, and $\eta_i$ are obtained from length study. The improvements in $J_{th}$, $T_0$, and $T_1$ reflect the strong carrier confinement which is important for achieving high cw power. Other device parameters, such as $\alpha_i$, $\eta_i$, $J_T$, and $\Gamma G_0$, are unaffected by the substrate misorientation, indicating that the interfacial roughness, which can affect $\alpha_i$ and $\eta_i$, is similar to the structure grown on 0.5° misoriented substrates.

TABLE 1

| Substrate misorientation | 10° towards <111> A | 0.5° towards <110> |
|---|---|---|
| $J_{th}$(A/cm²) | 450 | 514 |
| $J_T$(A/cm²) | 187 | 173 |
| $\Gamma \cdot G_0$(cm⁻¹) | 23 | 19 |
| $\alpha_i$(cm⁻¹) | 2 | 3 |
| $\eta_i$(%) | 77 | 75 |
| $T_0$(K) | 115 | 72 |
| $T_1$(K) | 285 | 153 |
| CW Power (W) | 2.9 (1.5 mm long) | 1.4 (2 mm long) |

Figure 16:
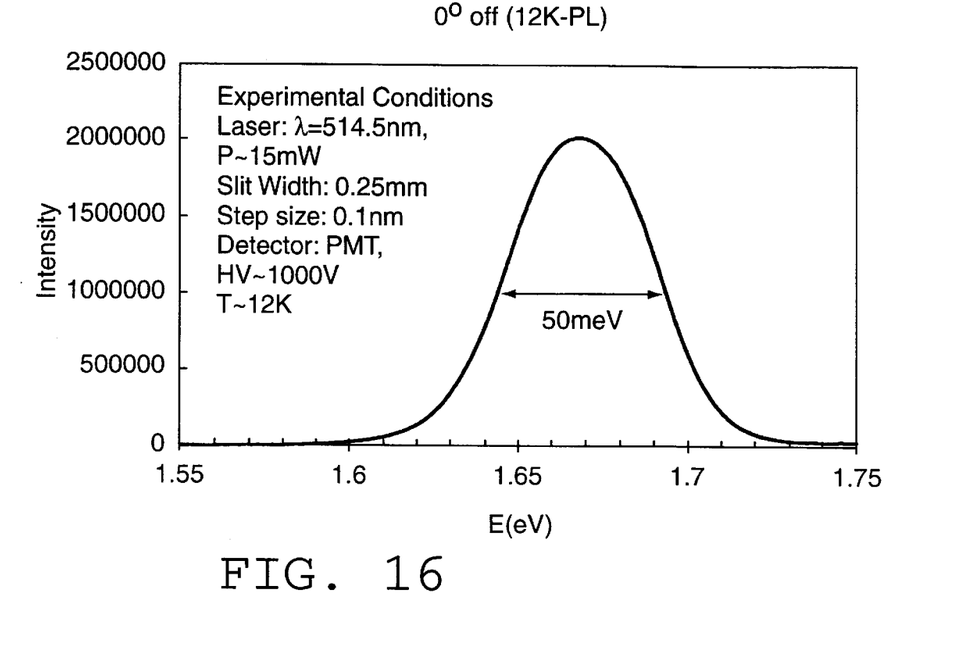
FIG. 16 is a diagram showing the low temperature photoluminescence spectrum for a laser of the type shown in FIG. 10 grown 0° off orientation (i.e., grown on orientation).
Figure 17:
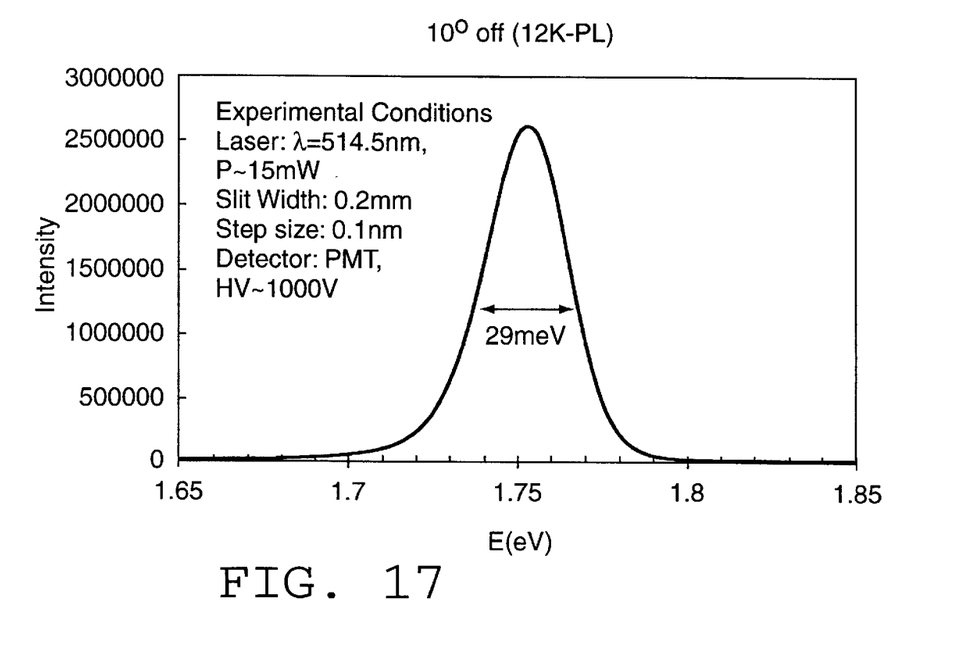
FIG. 17 is a diagram showing the low temperature photoluminescence spectrum of a laser of the type shown in FIG. 10 grown 10° off orientation.

Furthermore, it is found, for compressively-strained quantum-well devices, that high misorientation of the substrate significantly improves the active region quality. The use of low temperature (T=12 K) photoluminescence (PL) has been used to verify that InGaAsP quantum well material grown on a misoriented substrate (10° -off towards (111)A) exhibits improved crystalline quality. The measured PL linewidth (FWHM) decreases from 50 meV (0°-off) to 29 meV (10°-off), as illustrated by the spectra shown in FIGS. 16 and 17 for devices grown on-orientation and 10°-off orientation, respectively. These data reflect improved miscibility of the InGaAsP alloy when grown on a misoriented substrate. Furthermore, the use of misoriented substrates to obtain good crystalline quality of the compressively strained InGaAsP quantum well or wells can be extended to wavelengths well beyond 800 nm.

Figure 14:
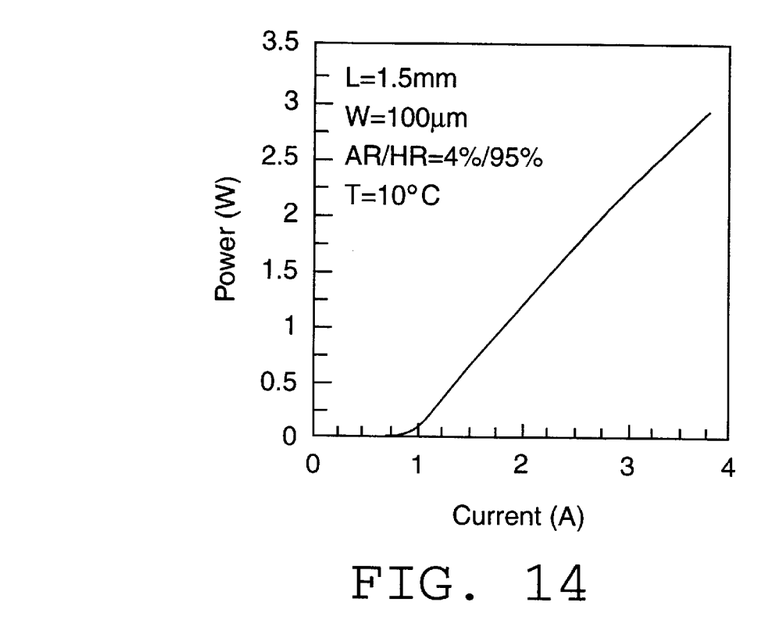
FIG. 14 is a plot of cw L-I characteristics for a facet-coated (4%/95%) 730 nm emitting quantum well (100 μm×1.5 mm) laser of the type shown in FIG. 10.
Figure 15:
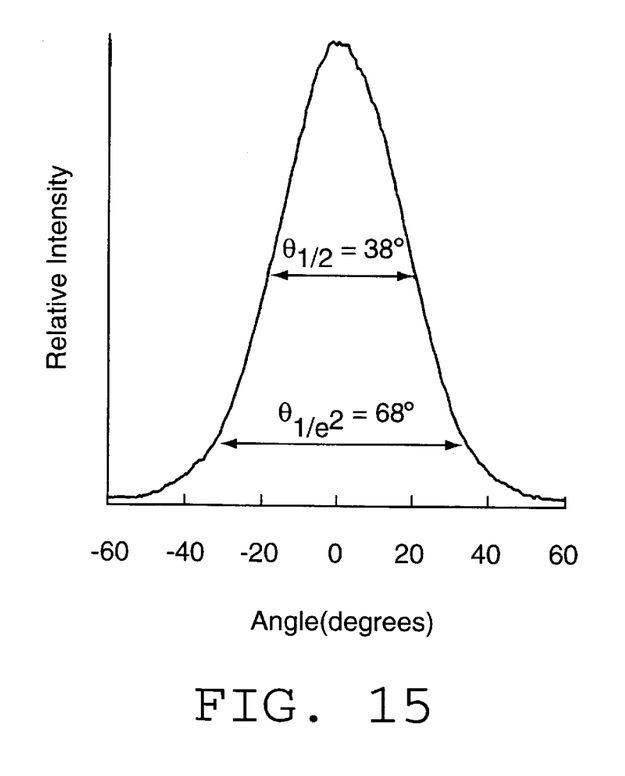
FIG. 15 is a diagram showing the measured far-field pattern in the transverse direction for a laser of the type shown in FIG. 10.
Figure 18:
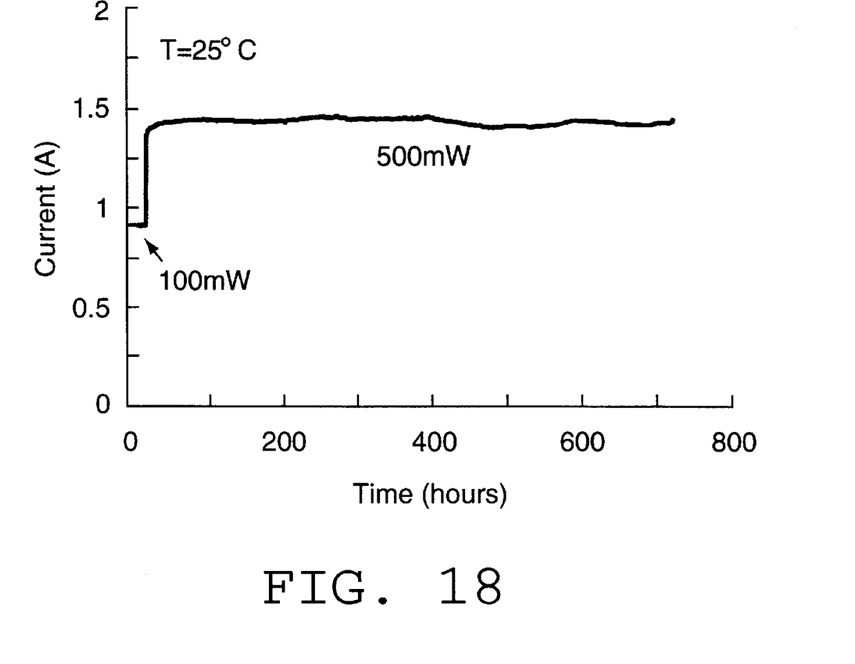
FIG. 18 is a diagram showing the measured reliability characteristics at a heatsink temperature of 25° C. for facet-coated devices of the type shown in FIG. 10.

High cw output power is possible as a result of the relatively large spot size, d/Γ=0.433 μm. Cw output power as high as 2.9 W (see FIG. 14) is achieved from facet-coated (4%/95% reflectivity of the two faces) broad-stripe (100 μm wide×1.5 mm long) devices mounted p-side down on diamond submounts at a heatsink temperature of 10° C. Sudden failure observed at a power level below the catastrophic optical mirror damage limit (COMD) indicates that the output power is limited by filamentation. The large spot size of the broad waveguide results in a relatively narrow transverse far-field pattern as illustrated in FIG. 15, corresponding to a single-transverse mode, with a full width at half maximum (FWHM), $\theta_1$, of 38°, and full width at 1/e² of 68° over the whole range of drive current. Preliminary reliability measurements at constant power of 0.5 W and held at a heatsink temperature of 25° C., as illustrated in FIG. 18, show no degradation for greater than 700 hours.

Figure 19:
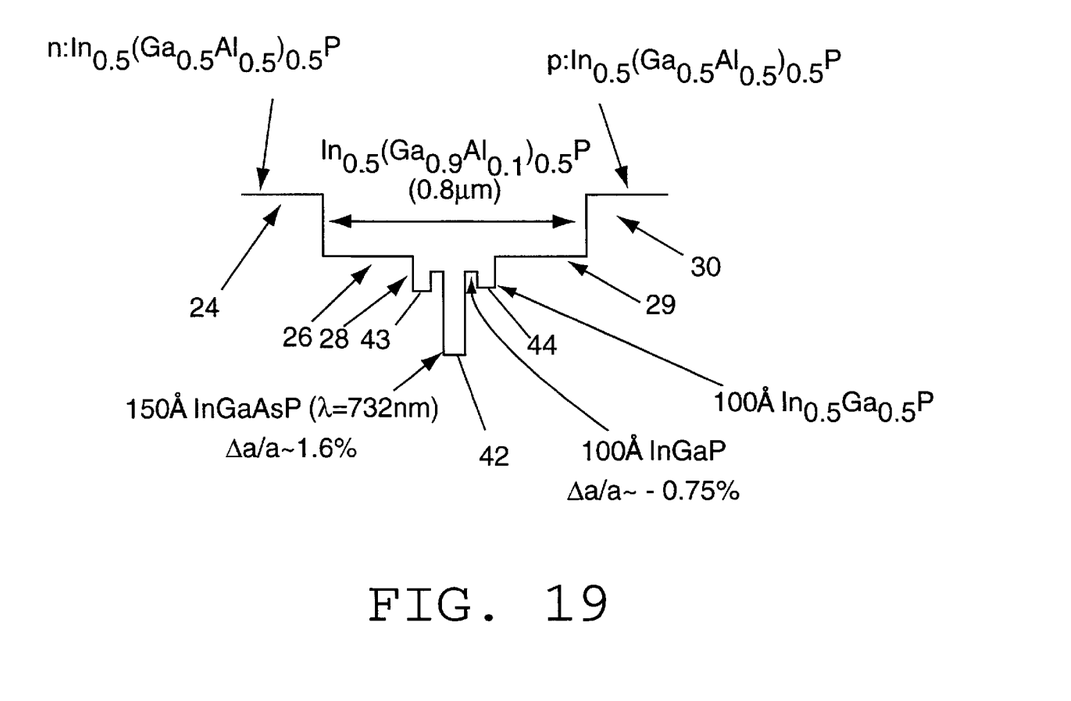
FIG. 19 is a schematic band-gap diagram of a further aluminum free active region emitting at 730 nm.

Laser structures as shown in FIG. 19 were grown by low pressure metal organic chemical vapor deposition on (100) GaAs substrates misoriented 10° towards <111>A, with the active region materials and thicknesses selected for emission at about 730 nm. The epitaxial structure includes a 150 Å thick compressively strained (Δa/a≈1.6%) InGaAsP quantum well 42 surrounded by transition layers 43 and 44 each formed of a double layer structure of 100 Å tensile strained InGaP and 100 Å $In_{0.5}Ga_{0.5}P$. High band-gap cladding layers 24 of n-type $In_{0.5}(Ga_{0.5}Al_{0.5})_{0.5}P$ and 30 of p-type $In_{0.5}(Ga_{0.5}Al_{0.5})_{0.5}P$, and $In_{0.5}(Ga_{0.9}Al_{0.1})_{0.5}P$ (0.8 μm total width) confining layers 26 and 29, are used to suppress carrier leakage. Table 2 below provides a comparison of the results obtained for three laser structures of this type, each grown on 10° off orientation substrates, at barrier layer tensile strains of 0%, 0.5% and 0.75%, and illustrates the benefits of strain compensation of the active region layer. That is, with increasing tensile strain in the barrier layers the internal efficiency, $\eta_i$, increases, and the $T_0$ and $T_1$ characteristic temperatures increase, which is indicative of better carrier confinement in the quantum well.

TABLE 2

| Tensile strain | 0 | 0.5% | 0.75% |
|---|---|---|---|
| $\lambda$(nm) | 732 | 720 | 730 |
| $J_{th}$(A/cm$^2$) | 450 | 447 | 424 |
| $J_T$(A/cm$^2$) | 187 | 150 | 177 |
| $\Gamma \cdot G_0$(cm$^{-1}$) | 23 | 17 | 19.7 |
| $\alpha_i$(cm$^{-1}$) | 2 | 4 | 3 |
| $\eta_i$(%) | 77 | 86 | 93 |
| $T_0$(K) | 115 | 116 | 124 |
| $T_1$(K) | 285 | 503 | 406 |

The present invention thus provides Al-free compressively strained active region lasers with high cw output power, reliable operation at a high power, and high values for the characteristic temperature coefficients, $T_0$ and $T_1$. These results are achieved by utilizing the reliability of an Al-free active layer in conjunction with the performance enhancement of completely disordered (high band-gap) confinement and cladding layers. By optimizing the strain of the quantum well and the tensile strain in the barrier layers, improving thermal management and growth uniformity to reduce filamentation, output power from such structures can be further increased.

It is understood that the invention is not confined to the particular embodiments set forth herein as illustrative, but embraces all such forms thereof as come within the scope of the following claims.

What is claimed is:

1. A semiconductor laser comprising:
a semiconductor substrate, an epitaxial structure on the substrate including a layer with an active region at which light emission occurs, confinement layers adjacent the active region layer, cladding layers adjacent the confinement layers, edge faces, electrodes by which voltage can be applied across the epitaxial structure and the substrate, and feedback structures to provide optical feedback for lasing in the active region layer, the active region layer comprising at least one compressively strained InGaAsP quantum well surrounded by transitional layers, the composition and width of the active region layer selected to emit light in the wavelength range of about 700 nm to 800 nm.

2. The semiconductor laser of claim 1 wherein the material of the transitional layers is selected from the group consisting of InGaP, GaAsP, and InGaAsP.

3. The semiconductor laser of claim 1 wherein the confinement layers are formed of InGaAlP and the cladding layers are also formed of InGaAlP doped respectively n-type and p-type.

4. The semiconductor laser of claim 3 wherein the confinement layers are formed of $In_{0.5}(Ga_{0.9}Al_{0.1})_{0.5}P$.

5. The semiconductor laser of claim 4 wherein the transitional layers are formed of $In_{0.5}Ga_{0.5}P$.

6. The semiconductor laser of claim 1 wherein the epitaxial structure is grown on a substrate surface off orientation with respect to a major crystalline plane.

7. The semiconductor laser of claim 1 wherein the epitaxial structure is grown on a substrate surface off orientation with respect to the crystalline plane (100).

8. The semiconductor laser of claim 7 wherein the epitaxial structure is grown on a (100) GaAs substrate misoriented at least 0.5°.

9. The semiconductor laser of claim 1 wherein the feedback structures are mirrored facets formed at the edge faces.

10. The semiconductor laser of claim 1 wherein the epitaxial structure is grown on a surface of the GaAs substrate misoriented approximately 5° to 20° from (100) toward <111>.

11. The semiconductor laser of claim 1 including means for confining the current from the electrodes to a stripe region.

12. The semiconductor laser of claim 1 wherein the stripe width is about 100 $\mu$m.

13. The semiconductor laser of claim 1 wherein the active region layer has multiple quantum wells defined by layers of InGaAsP separated by InGaP.

14. The semiconductor laser of claim 1 wherein the confinement layers are formed of $In_{0.5}(Al_xGa_{1-x})_{0.5}P$ wherein $0.0 \leq x \leq 0.3$.

15. The semiconductor laser of claim 1 wherein the cladding layers are formed of $In_{0.5}(Al_yGa_{1-y})_{0.5}P$ wherein $0.3 \leq y \leq 0.8$.

16. The semiconductor laser of claim 1 wherein the transition layers are partially grown in tensile strain to provide a strain compensated active region layer.

17. The semiconductor laser of claim 1 wherein the substrate is GaAs.

18. A semiconductor laser comprising:
a GaAs semiconductor substrate, an epitaxial structure grown on a surface of the substrate off orientation and including a layer with an active region at which light emission occurs, confinement layers of InGaAlP adjacent the active region layer, cladding layers of InGaAlP adjacent the confinement layers, edge faces, electrodes by which voltage can be applied across the epitaxial structure and the substrate, and feedback structures to provide optical feedback for lasing in the active region layer, the active region layer comprising at least one compressively strained InGaAsP quantum well surrounded by transitional layers, the composition and width of the active region layer selected to emit light in the wavelength range of about 700 nm to 800 nm.

19. The semiconductor laser of claim 18 wherein the material of the transitional layers is selected from the group consisting of InGaP, GaAsP, and InGaAsP.

20. The semiconductor laser of claim 18 wherein the confinement layers are formed of $In_{0.5}(Ga_{0.9}Al_{0.1})_{0.5}P$, and the transitional layers are formed of $In_{0.5}Ga_{0.5}P$.

21. The semiconductor laser of claim 18 wherein the epitaxial structure is grown on a (100) GaAs substrate misoriented at least 0.5°.

22. The semiconductor laser of claim 18 wherein the feedback structures are mirrored facets formed at the edge faces.

23. The semiconductor laser of claim 18 wherein the epitaxial structure is grown on a (100) GaAs substrate misoriented approximately 5° to 20° from (100) toward <111>.

24. The semiconductor laser of claim 18 including means for confining the current from the electrodes to a stripe region.

25. The semiconductor laser of claim 24 wherein the stripe width is about 100 $\mu$m.

26. The semiconductor laser of claim 18 wherein the active region layer has multiple quantum wells defined by layers of InGaAsP separated by InGaP.

27. The semiconductor laser of claim 18 wherein the confinement layers are formed of $In_{0.5}(Al_xGa_{1-x})_{0.5}P$ wherein $0.0 \leq x \leq 0.3$.

28. The semiconductor laser of claim 18 wherein the cladding layers are formed of $In_{0.5}(Al_yGa_{1-y})_{0.5}P$ wherein $0.3 \leq y \leq 0.8$.

29. The semiconductor laser of claim 18 wherein the InGaP transition layers are partially grown in tensile strain to provide a strain compensated active region.

30. A semiconductor laser comprising:

a GaAs semiconductor substrate, an epitaxial structure on the substrate including a layer with an active region at which light emission occurs, confinement layers adjacent the active region layer, cladding layers adjacent the confinement layers, edge faces, electrodes by which voltage can be applied across the epitaxial structure and the substrate, and feedback structures to provide optical feedback for lasing in the active region layer, the active region layer comprising at least one compressively strained InGaAsP quantum well surrounded by transitional layers, the composition and width of the active region layer selected to emit light in the wavelength range of at least 700 nm, wherein the epitaxial structure is grown on a substrate surface off orientation at least 5° with respect to a major crystalline plane.

31. The semiconductor laser of claim 30 wherein the material of the transitional layers is selected from the group consisting of InGaP, GaAsP, and InGaAsP.

32. The semiconductor laser of claim 30 wherein the confinement layers are formed of InGaAlP and the cladding layers are also formed of InGaAlP doped respectively n-type and p-type.

33. The semiconductor laser of claim 30 wherein the confinement layers are formed of $In_{0.5}(Ga_{0.9}Al_{0.1})_{0.5}P$ and the transitional layers are formed of $In_{0.5}Ga_{0.5}P$.

34. The semiconductor laser of claim 30 wherein the epitaxial structure is grown on a substrate surface off orientation with respect to the crystalline plane (100).

35. The semiconductor laser of claim 30 wherein the epitaxial structure is grown on a (100) GaAs substrate.

36. The semiconductor laser of claim 30 wherein the feedback structures are mirrored facets formed at the edge faces.

37. The semiconductor laser of claim 30 wherein the epitaxial structure is grown on a surface of the substrate misoriented approximately 5° to 20° from (100) toward <111>.

38. The semiconductor laser of claim 30 including means for confining the current from the electrodes to a stripe region.

39. The semiconductor laser of claim 30 wherein the stripe width is about 100 µm.

40. The semiconductor laser of claim 30 wherein the active region layer has multiple quantum wells defined by layers of InGaAsP separated by InGaP.

41. The semiconductor laser of claim 30 wherein the confinement layers are formed of $In_{0.5}(Al_xGa_{1-x})_{0.5}P$ wherein $0.0 \leq x \leq 0.3$.

42. The semiconductor laser of claim 30 wherein the cladding layers are formed of $In_{0.5}(Al_yGa_{1-y})_{0.5}P$ wherein $0.3 \leq y \leq 0.8$.

43. The semiconductor laser of claim 30 wherein the transition layers are partially grown in tensile strain to provide a strain compensated active region layer.

* * * * *